US012591025B2

(12) United States Patent　　　　(10) Patent No.:　US 12,591,025 B2
Shewmon et al.　　　　　　　　　　　(45) Date of Patent:　　Mar. 31, 2026

(54) PASSIVE FREQUENCY COMPENSATION WITH COIL PAIRS

(71) Applicant: Allegro MicroSystems, LLC, Manchester, NH (US)

(72) Inventors: Nathan Shewmon, Braunschweig (DE); Christian Kasparek, Heidelberg (DE)

(73) Assignee: Allegro MicroSystems, LLC, Manchester, NH (US)

( * ) Notice: Subject to any disclaimer, the term of this patent is extended or adjusted under 35 U.S.C. 154(b) by 158 days.

(21) Appl. No.: 18/624,540

(22) Filed: Apr. 2, 2024

(65) Prior Publication Data

US 2025/0306134 A1　　　Oct. 2, 2025

(51) Int. Cl.
　　*G01R 33/00* 　　　(2006.01)
　　*G01R 33/07* 　　　(2006.01)
　　*G01R 33/09* 　　　(2006.01)
(52) U.S. Cl.
　　CPC ..... *G01R 33/0094* (2013.01); *G01R 33/0052* (2013.01); *G01R 33/07* (2013.01); *G01R 33/09* (2013.01)
(58) Field of Classification Search
　　None
　　See application file for complete search history.

(56) References Cited

U.S. PATENT DOCUMENTS 4,268,785 A　　5/1981　Svendsen
4,339,715 A　　7/1982　Bloodworth et al.

5,912,556 A　　6/1999　Frazee et al.
6,035,712 A　　3/2000　Ohta et al.
6,252,395 B1　　6/2001　Aoyama et al.
6,781,359 B2　　8/2004　Stauth et al.
7,116,099 B2　　10/2006　Saito
7,265,531 B2　　9/2007　Stauth et al.
7,923,996 B2　　4/2011　Doogue et al.
(Continued)

FOREIGN PATENT DOCUMENTS

WO　　WO 2004/027436　　4/2004

OTHER PUBLICATIONS

PCT Search Report and Written Opinion dated Nov. 14, 2011; for International Application No. PCT/US2011/051492; 11 pages.
(Continued)

*Primary Examiner* — Jas A Sanghera
(74) *Attorney, Agent, or Firm* — DALY, CROWLEY, MOFFORD & DURKEE, LLP

(57)　　　　　ABSTRACT

Systems, structures, circuits, and methods provide coil pairs that are used with magnetic-field type current sensors. Coil pairs, with a smaller coil nested within a larger coil, can be employed with or for magnetic field/flux sensors or sensing elements to compensate for the degradation in sensitivity as the frequency of the sensed current increases. A coil pair can be integrated into or on a substrate having a field-based current sensor. In use, frequency-dependent current is induced in a larger coil that is then driven through a smaller coil which concentrates a magnetic field on the sensitive element. The larger coil is configured to provide an increasing current as the frequency of the ambient magnetic field increases and provide the increasing current to the second coil to compensate for a frequency-dependent coupling factor between the magnetic field sensor and the ambient magnetic field.

26 Claims, 6 Drawing Sheets

(56)  References Cited

U.S. PATENT DOCUMENTS

| | | |
|---|---|---|
| 8,030,918 B2 | 10/2011 | Doogue et al. |
| 8,339,134 B2 | 12/2012 | Chen et al. |
| 8,447,556 B2 | 5/2013 | Friedrich et al. |
| 8,451,002 B2 | 5/2013 | Chen et al. |
| 8,542,010 B2 | 9/2013 | Cesaretti et al. |
| 8,542,011 B2 | 9/2013 | Chen et al. |
| 8,680,846 B2 | 3/2014 | Cesaretti et al. |
| 8,692,546 B2 | 4/2014 | Cesaretti et al. |
| 8,729,892 B2 | 5/2014 | Friedrich |
| 8,818,749 B2 | 8/2014 | Friedrich et al. |
| 9,151,807 B2 | 10/2015 | Friedrich et al. |
| 9,625,534 B2 | 4/2017 | Cadugan et al. |
| 12,306,217 B2 | 5/2025 | Houis |
| 2001/0003421 A1 | 6/2001 | Kubota et al. |
| 2009/0140726 A1* | 6/2009 | Janke .................... G01R 33/07 |
| | | 324/207.13 |

OTHER PUBLICATIONS

European Communication with Comments on Written Opinion and Amendment of the Application; dated Apr. 23, 2013; for EP Pat. App. No. 11767844.1; 2 pages.

PCT International Preliminary Report on Patentability of the ISA; dated Apr. 9, 2013; for PCT Pat. App. No. PCT/US2011/051492; 8 pages.

Notice of Allowance; dated Aug. 21, 2012; for U.S. Appl. No. 12/900,969; 8 pages.

Office Action dated Oct. 18, 2012; for U.S. Appl. No. 13/617,724; 8 pages.

Notice of Allowance; dated Jan. 22, 2013; for U.S. Appl. No. 13/617,724; 8 pages.

Notice of Allowance dated May 31, 2013, for U.S. Appl. No. 13/855,279; 9 pages.

* cited by examiner

100A

100B

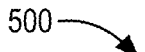

500

Providing a first coil disposed on a first substrate and defining a first footprint on the first substrate, wherein the first coil is configured for inductive coupling with an ambient magnetic field

502

Providing a second coil disposed on a second substrate and defining a second footprint on the second substrate, wherein the second coil is disposed within the first footprint, wherein the second footprint is smaller than the first footprint, and wherein the second coil is connected to the first coil

504

Providing a magnetic field sensor disposed within the second footprint and including a plurality of magnetic field sensing elements connected to an integrated circuit (IC), wherein the magnetic field sensor is configured to detect the ambient magnetic field and a compensating magnetic field produced by the second coil, and produce an output signal indicative of a current producing the ambient magnetic field

506

Wherein the first coil is configured to provide a current, which increases as the ambient magnetic field increases with frequency, and provide the current to the second coil to compensate for a frequency-dependent coupling factor between the magnetic field sensor and the ambient magnetic field

508

Wherein the first coil and/or second coil comprises a plurality of coil loops and respective switches connected to the coil loops, wherein each switch is configured to selectively short the respective coil loop for adjusting a number of active coil loops configured to conduct a current in the first coil

PASSIVE FREQUENCY COMPENSATION WITH COIL PAIRS

BACKGROUND

Various types of electrical current sensors are known in the art. Magnetic field current sensors include one or more magnetic field sensing elements positioned near a conductor to sense a magnetic field generated by an electrical current flowing through the conductor. In some arrangements, a magnetic field current sensor can generate an output signal having a magnitude proportional to the magnetic field induced by the current through the conductor. In other arrangements, a magnetic field sensor can generate an output signal having a magnitude proportional to the difference in magnetic fields induced by a current at two different locations relative to the current conductor.

Current sensors are used in many applications such as industrial, aeronautical, and automotive applications, with the latter notably including electric vehicle (EV) and hybrid applications. The overall safety and/or efficiency of systems and devices that utilize current sensors can depend on the accuracy and reliability of the include current sensor(s). Field-based current sensors typically exhibit a decline in accuracy at higher frequencies due to a decrease in coupling factor between the magnetic field produced by the conductors under interrogation and the magnetic field sensing elements used by the sensors.

SUMMARY

Aspects of the present disclosure are directed to passive frequency compensation utilizing coil pairs, e.g., for measuring current in a conductor using a magnetic field sensor with field-based elements. The coil pairs can include a larger coil coupled to a smaller coil. As frequency of an ambient magnetic field (e.g., as produced by current flowing in a nearby conductor) increases, induced current in the larger coil increases, due to Faraday's law of induction. The induced current flowing through the large coil drives current in the smaller coil. The magnetic field generated by the current in the small coil consequently can compensate for reduced coupling factor (a coupling factor that decreases or degrades with increasing frequency) of the ambient magnetic field and the field element(s) of the sensor.

One general aspect of the present disclosure includes a frequency-compensating current sensor. The frequency-compensating current sensor can include: a first coil disposed on a first substrate and defining a first footprint on the first substrate, where the first coil is configured for inductive coupling with an ambient magnetic field; a second coil disposed on a second substrate and defining a second footprint on the second substrate, where the second coil is disposed within the first footprint, where the second footprint is smaller than the first footprint, and where the second coil is connected to the first coil; and a magnetic field sensor disposed within the second footprint and including a plurality of magnetic field sensing elements connected to an integrated circuit (IC), where the magnetic field sensor is configured to detect the ambient magnetic field and a compensating magnetic field produced by the second coil, and produce an output signal indicative of a current producing the ambient magnetic field; where the first coil is configured to provide an increasing current as the frequency of the ambient magnetic field increases and provide the increasing current to the second coil to compensate for a frequency-dependent coupling factor between the magnetic field sensor and the ambient magnetic field.

Implementations may include one or more of the following features. The first substrate of the sensor may include a printed circuit board (PCB). The first substrate may include the second substrate. The second substrate may include a semiconductor die. The IC may be disposed on the semiconductor die. The plurality of magnetic field sensing elements may be configured in a bridge. The plurality of magnetic field sensing elements may include a plurality of Hall effect elements. The plurality of magnetic field sensing elements may include a plurality of magnetoresistance (MR) elements. The plurality of magnetoresistance (MR) elements may include a plurality of tunneling magnetoresistance (TMR) elements. The plurality of magnetoresistance (MR) elements may include a plurality of giant magnetoresistance (GMR) elements. The plurality of magnetoresistance (MR) elements may include a plurality of anisotropic magnetoresistance (AMR) elements. The first coil may include a plurality of coil loops and respective switches connected to the plurality of coil loops, where each switch is configured to selectively short the respective coil loop for adjusting a number of active coil loops configured to conduct a current in the first coil. The second coil may include a plurality of coil loops and respective switches connected to the plurality of coil loops, where each switch is configured to selectively short the respective coil loop for adjusting a number of active coil loops configured to conduct a current in the second coil.

Another general aspect of the present disclosure includes a method of making a frequency-compensating current sensor. The method can include: providing a first coil disposed on a first substrate and defining a first footprint on the first substrate, where the first coil is configured for inductive coupling with an ambient magnetic field; providing a second coil disposed on a second substrate and defining a second footprint on the second substrate, where the second coil is disposed within the first footprint, where the second footprint is smaller than the first footprint, and where the second coil is connected to the first coil; and providing a magnetic field sensor disposed within the second footprint and including a plurality of magnetic field sensing elements connected to an integrated circuit (IC), where the magnetic field sensor is configured to detect the ambient magnetic field and a compensating magnetic field produced by the second coil, and produce an output signal indicative of a current producing the ambient magnetic field; where the first coil is configured to provide an increasing current as the frequency of the ambient magnetic field increases and provide the increasing current to the second coil to compensate for a frequency-dependent coupling factor between the magnetic field sensor and the ambient magnetic field.

Implementations may include one or more of the following features. The first substrate may include a printed circuit board (PCB). The first substrate may include the second substrate. The second substrate may include a semiconductor die. The IC may be disposed on the semiconductor die. The plurality of magnetic field sensing elements may be configured in a bridge. The plurality of magnetic field sensing elements may include a plurality of Hall effect elements. The plurality of magnetic field sensing elements may include a plurality of magnetoresistance (MR) elements. The plurality of magnetoresistance (MR) elements may include a plurality of tunneling magnetoresistance (TMR) elements. The plurality of magnetoresistance (MR) elements may include a plurality of giant magnetoresistance (GMR) elements. The plurality of magnetoresistance (MR)

elements may include a plurality of anisotropic magnetoresistance (AMR) elements. The first coil may include a plurality of coil loops and respective switches, where each switch is configured to selectively short the respective coil loop for adjusting a number of active coil loops configured to conduct a current in the first coil. The second coil may include a plurality of coil loops and respective switches, where each switch is configured to selectively short the respective coil loop for adjusting a number of active coil loops configured to conduct a current in the second coil.

The features and advantages described herein are not all-inclusive; many additional features and advantages will be apparent to one of ordinary skill in the art in view of the drawings, specification, and claims. Moreover, it should be noted that the language used in the specification has been selected principally for readability and instructional purposes, and not to limit in any way the scope of the present disclosure, which is susceptible of many embodiments. What follows is illustrative, but not exhaustive, of the scope of the present disclosure.

BRIEF DESCRIPTION OF THE DRAWINGS

The manner and process of making and using the disclosed embodiments may be appreciated by reference to the figures of the accompanying drawings. In the figures like reference characters refer to like (similar) components, parts, elements, or steps/actions; however, similar components, parts, elements, and steps/actions may be referenced by different reference characters in different figures. It should be appreciated that the components and structures illustrated in the figures are not necessarily to scale, emphasis instead being placed upon illustrating the principals of the concepts described herein. Furthermore, embodiments are illustrated by way of example and not limitation in the figures, in which:

FIG. 5 is a diagram showing steps in an example method of fabricating magnetic field sensors with coil pairs for passive frequency compensation, in accordance with the present disclosure.

DETAILED DESCRIPTION

The features and advantages described herein are not all-inclusive; many additional features and advantages will be apparent to one of ordinary skill in the art in view of the drawings, specification, and claims. Moreover, it should be noted that the language used in the specification has been selected principally for readability and instructional purposes, and not to limit in any way the scope of the inventive subject matter. The subject technology is susceptible of many embodiments. What follows is illustrative, but not exhaustive, of the scope of the subject technology.

Aspects, examples, and embodiments of the present disclosure are directed to and include systems, structures, circuits, and methods providing passive frequency compensation for magnetic-field-based (field-based) current sensors by employing coil pairs. Coil pairs, with a smaller coil nested within a larger coil, can be employed with or for magnetic field/flux sensors or sensing elements to compensate for the degradation in sensitivity as the frequency of the sensed current increases. A coil pair can be integrated into or on a substrate having a field-based current sensor.

In use, frequency-dependent current is induced in a larger coil that is then driven through a smaller coil which concentrates a magnetic field on the sensitive element. The larger coil is configured to provide an increasing current as the frequency of the ambient magnetic field increases and provide the increasing current to the second coil to compensate for a frequency-dependent magnetic coupling factor between the magnetic field sensor and the ambient magnetic field. The term "magnetic coupling factor" (or simply, "coupling factor") can be defined as the ratio between the current in the conductor to be sensed (e.g., a busbar) and the field at the field-based element(s) (e.g., Hall plates) in the sensor.

Any suitable field-based sensing element can be used, e.g., Hall-effect sensing elements, GMR elements, TMR elements, AMR elements etc. This passive compensation requires no active control, no added digital/EEPROM requirements, and does not increase the power consumption of the sensor. The current that generates the compensatory field is harvested from the detected (ambient) field. In some embodiments, a nested coil pair can be configured around more than one magnetic field sensing elements, e.g., a plurality of elements configured in a bridge. In some embodiments, customized/optimized coil pairs can be designed to compensate for the frequency response of a given conductor-core-sensor application or conductor-sensor application (as cores can be omitted within the scope of the present disclosure), or more generic sets of coils can be designed and then trimmed (calibrated) to meet application requirements, e.g., in a one-time calibration process done by a customer.

Figure 1A:
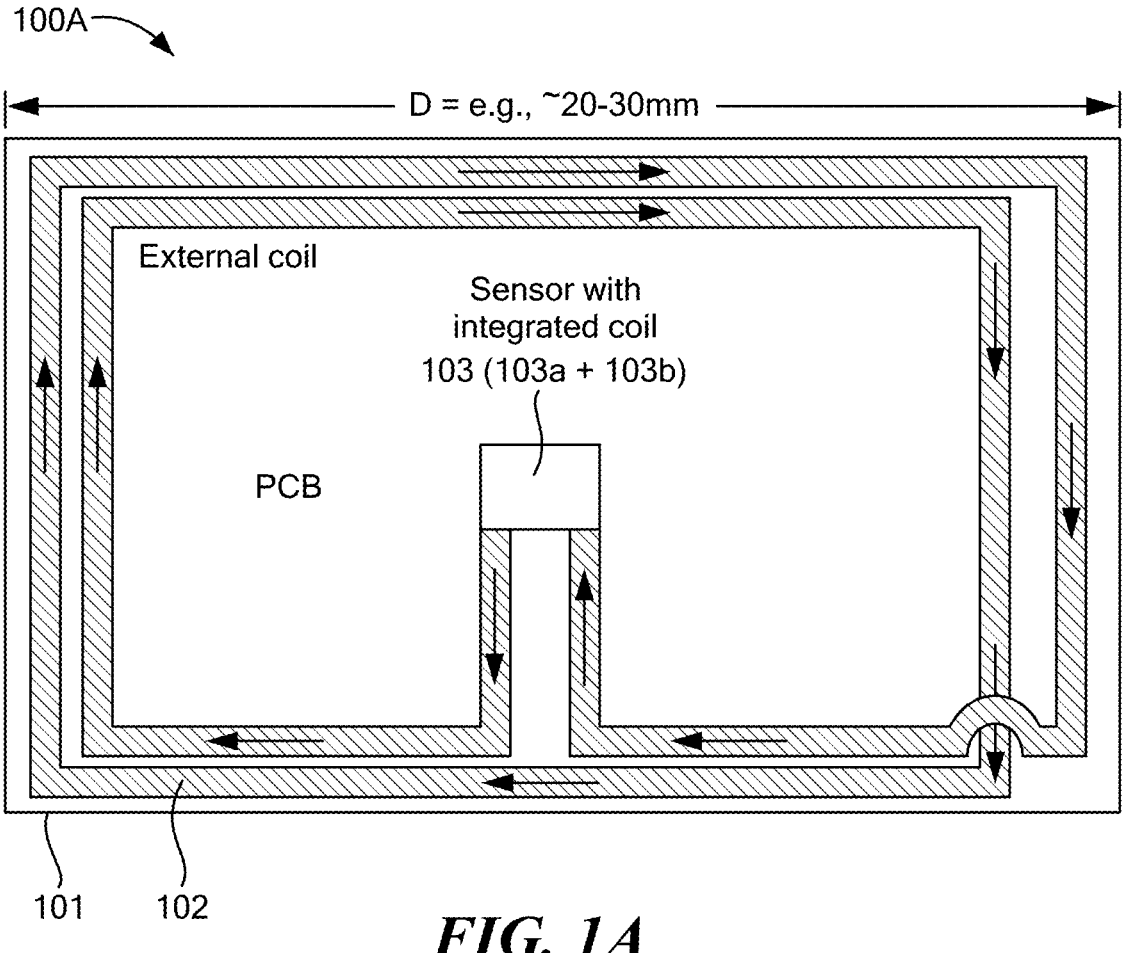
FIG. 1A is a top view of a current sensor including a coil pair for passive frequency compensation, in accordance with the present disclosure.

FIG. 1A is a top view of a current sensor 100A including a coil pair for passive frequency compensation, in accordance with the present disclosure. Sensor 100A is shown with a substrate 101 and external coil 102 disposed on substrate 101. Sensor 100A also includes an integrated circuit (IC) 103 that includes a magnetic-field-based current sensor 103a and a second coil 103b. IC 103 may be packaged (as shown) or unpackaged. As shown, second coil 103b is smaller than and disposed within the footprint of the larger (first) external coil 102. Any suitable substrate 101 may be used. Examples may include, but are not limited to, printed circuit boards (PCBs), ceramic substrates, glass, substrates, etc. An example (width) dimension is shown for the sensor 100A; other dimensions for such a sensor are of course within the scope of the present disclosure.

In operation of sensor 100A, as frequency of an ambient magnetic field (e.g., as produced by current flowing in a nearby conductor) increases, induced current in the large coil (loop) 102 increases, due to Faraday's law of induction. The induced current flowing through the large coil 102 drives current in the small (loop) coil 103b, as the two coils are connected. The magnetic field generated by the current in the small coil 103b compensates for reduced coupling factor (CF) over frequency, as shown in FIG. 1B.

For embodiments such as shown in FIG. 1A, if the larger coil (which harvests the power to generate the compensatory field) is on the substrate (e.g., PCB), it can be much larger than the smaller coil and can have a stronger effect at a lower frequency.

Figure 1B:
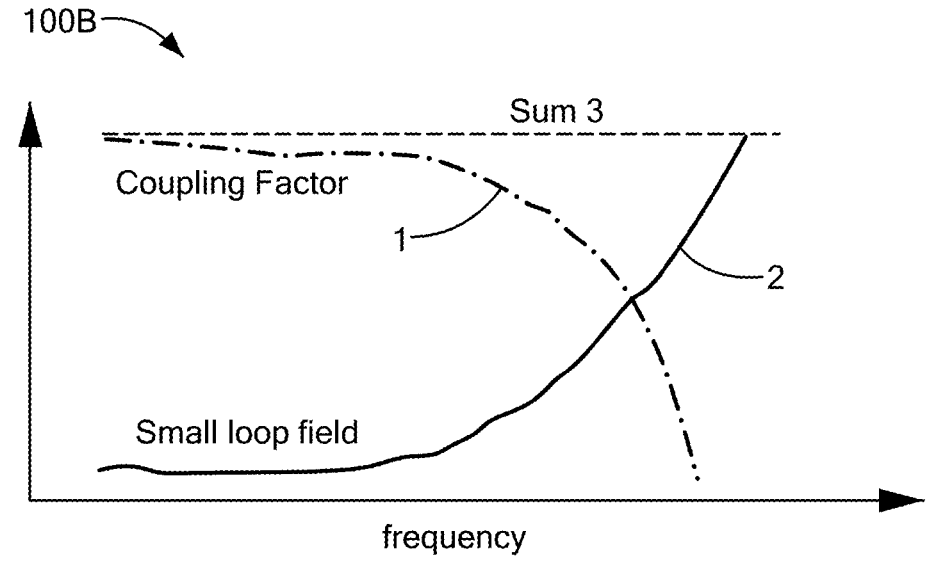
FIG. 1B is a graph depicting the frequency-dependent attenuation of the coupling factor, between the current sensor and the ambient field, plotted with the compensating frequency-dependent field provided by a coil pair, in accordance with the present disclosure.

FIG. 1B is a graph 100B depicting the frequency-dependent attenuation of the coupling factor, between the current sensor 103a and the ambient magnetic field, plotted with the compensating (compensatory) frequency-dependent field provided by the coil pair 102 and 103b, in accordance with the present disclosure. As can be seen by 100B, as the frequency of the ambient magnetic field (sensed by field-based current sensor 103a) increases, the coupling factor between the magnetic field and current sensor 103a decreases (plot 1). In some examples, a significant drop off (shoulder) may be present, e.g., at or around 10 kHz. As is also shown, as the frequency of the ambient magnetic field (sensed by field-based current sensor 103a) increases, the current induced in the larger coil 102 and also the connected smaller coil 103b increases (plot 2), due to Faraday's law of induction. The combined or summed effect is shown (plot 3), representing the augmented or compensated field sensed by the sensor 103a over the frequency range shown.

Figure 2:
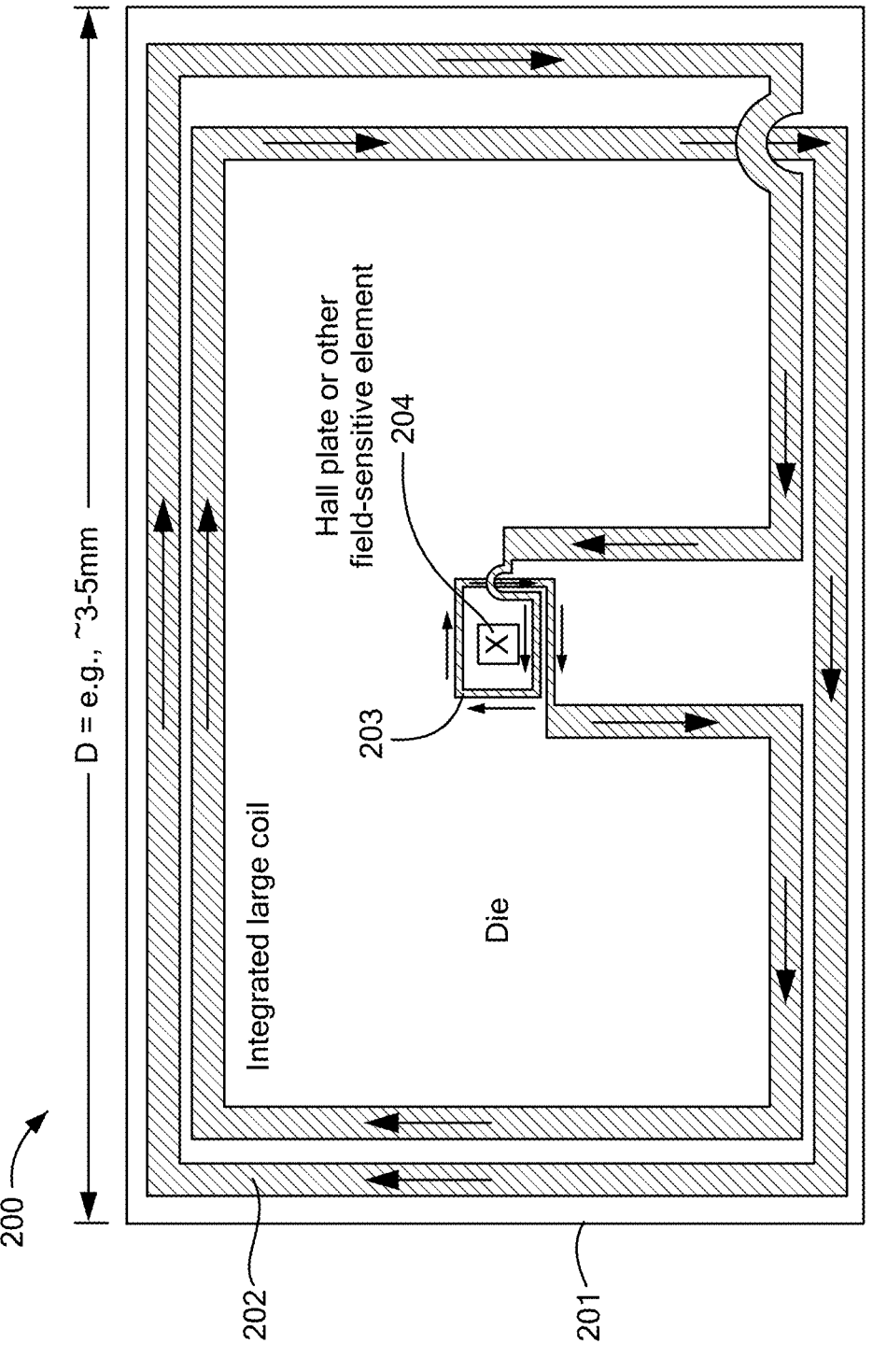
FIG. 2 is a top view of an alternate embodiment of a current sensor with a coil pair for passive frequency compensation, in accordance with the present disclosure.

FIG. 2 is a top view of an alternate embodiment of a current sensor 200 with a coil pair for passive frequency compensation, in accordance with the present disclosure. Sensor 200 is shown with die 201 and first (larger) coil 202 and second (smaller) coil being disposed on die 201. Sensor 200 also includes a magnetic-field-based sensing element 204. As shown, second coil 203 is smaller than and disposed within the footprint of the larger coil 202. An example (width) dimension is shown for the sensor 200; other dimensions for such a sensor are of course within the scope of the present disclosure.

If the larger coil 202 (which harvests the power to generate the compensatory field) is integrated on the die 201, no additional circuitry may be required (e.g., on a PCB holding die 201 or on die 201 itself), but the size is limited and so the compensation may be less strong and/or will be active at a higher frequency compared to an application where larger coil 202 were to be disposed in a larger substrate such as a PCB (see FIG. 1).

Figure 3:
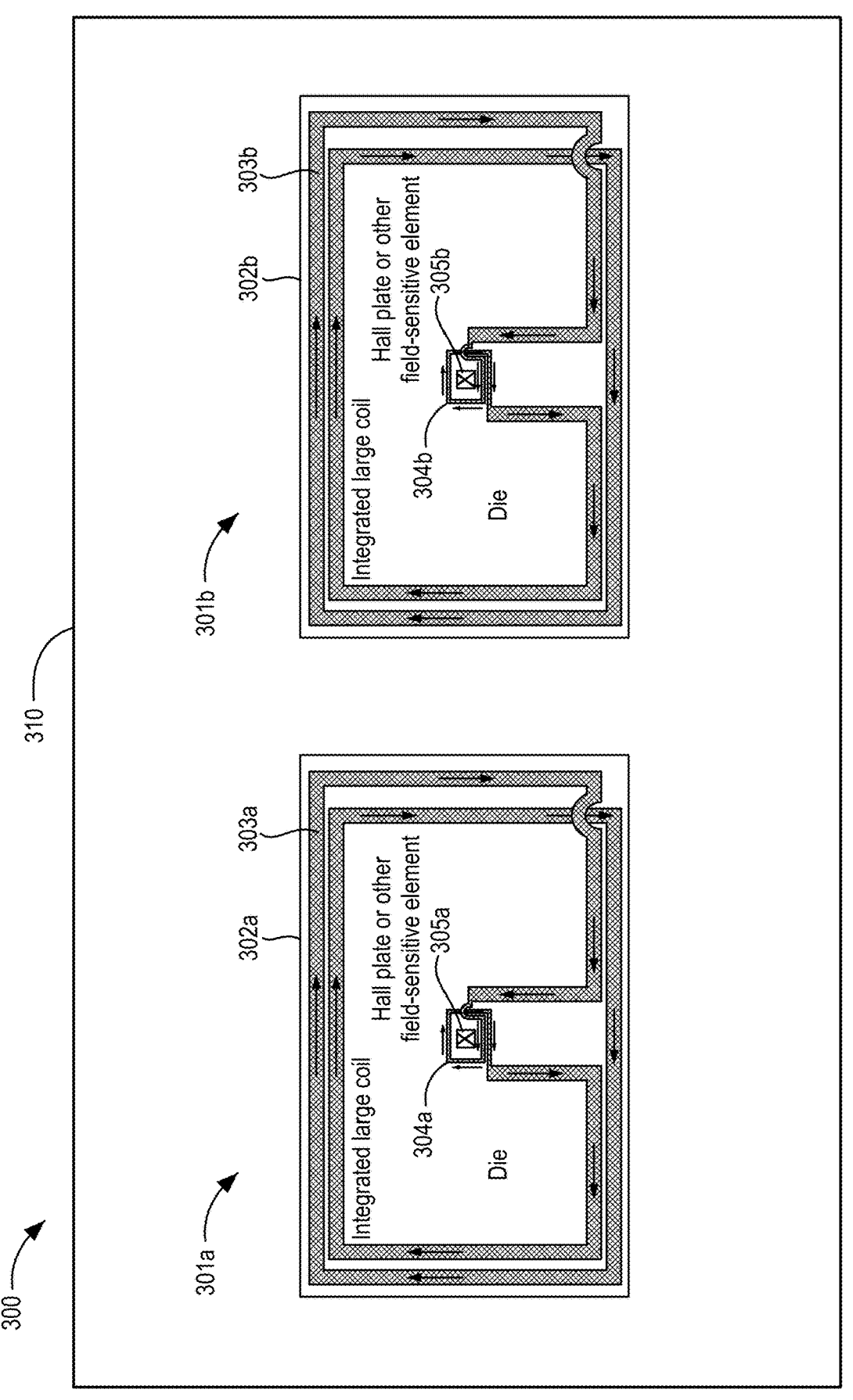
FIG. 3 is a top view of another example current sensor with two field-element-coil-pair sensor subunits, each providing passive frequency compensation, in accordance with the present disclosure.

FIG. 3 is a top view of another example current sensor 300 with two field-element-coil-pair sensor subunits 301a-b, each providing passive frequency compensation, in accordance with the present disclosure. Sensor subunits (assemblies) 300a-b are shown with respective die 302a-b. Sensor subunits 300a-b include larger (first) coils 303a-b, respectively, a smaller (second) coil 304a-b, respectively, configured (nested) within the larger coils 303a-b, and one or more field-based sensing elements 305a-b (e.g., xMR or Hall effect), respectively.

Die 302a and 302b may include circuitry (not shown) connected to and receiving signals from the field-based sensing elements 305a-b; the circuitry can include one or more processing units (processors) and memory suitable for processing output signals from the field-based sensing elements 305a-b, e.g., for determining current carried by a conductor producing the sensed ambient magnetic field(s). Such circuitry can also include other components and/or connections (not shown), e.g., for receiving power and providing output signals. Die 302a and 302b can be disposed on a substrate 310, e.g., a PCB, as shown.

Figure 4:
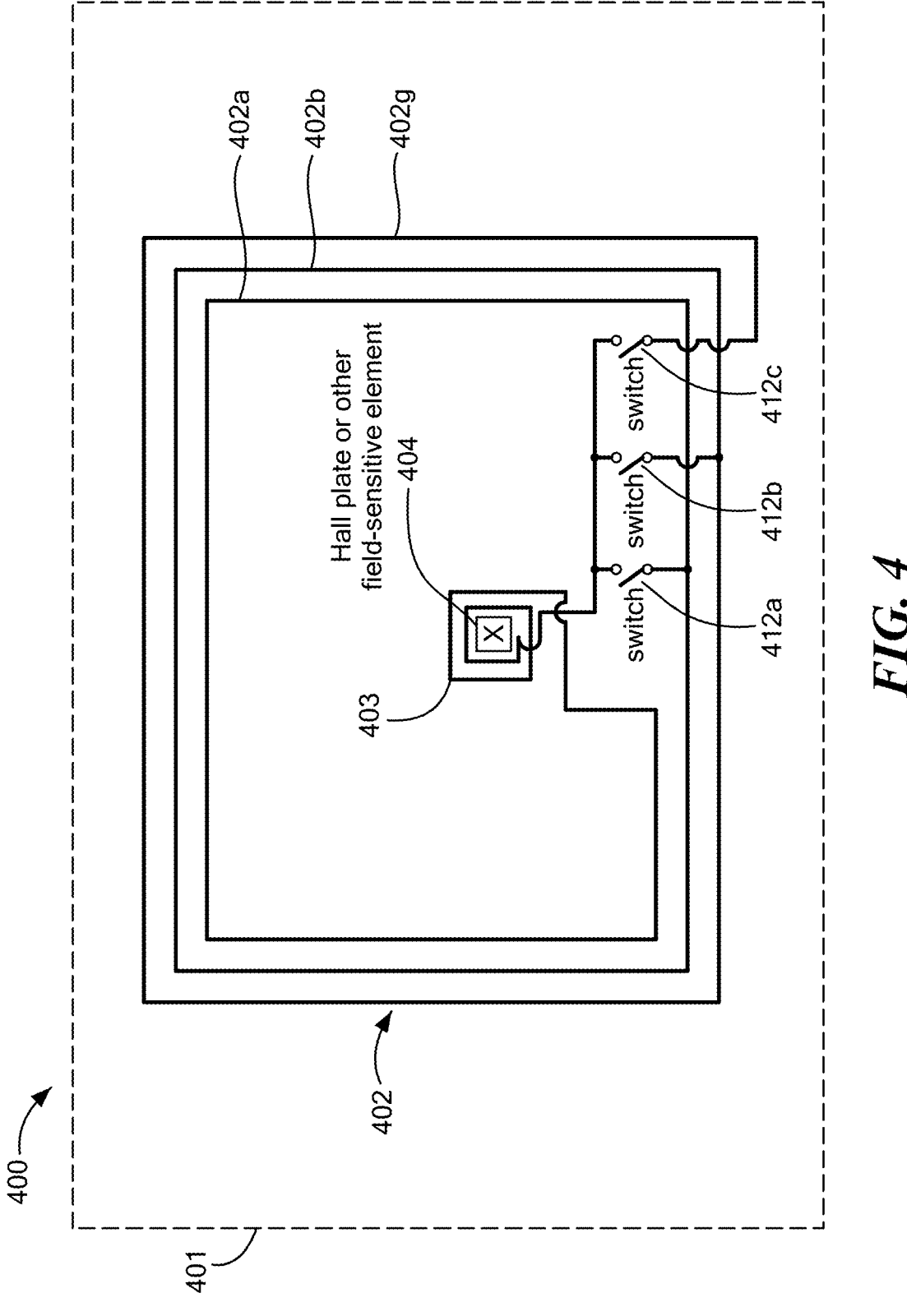
FIG. 4 is a top view of a further embodiment of a current sensor with switches for adjusting the number of active coil turns in a coil of a coil pair used for passive frequency compensation, in accordance with the present disclosure.

FIG. 4 is a top view of a further embodiment of a current sensor 400 having switches for adjusting the number of active coil turns in a coil of a coil pair used for passive frequency compensation, in accordance with the present disclosure. Sensor 400 is shown with a substrate 401 as well as a first (larger) coil 402 and a second (smaller) coil 403 disposed on/in substrate 401. Sensor 400 also includes one or more field-based (magnetic field sensitive) elements, shown as 404, e.g., one or more Hall effect elements, one or more TMR elements, etc. Sensor 400 also includes one or more switches, shown as 412a-c connected to coils turns 402a, 402b, 402g of coil 402.

The magnitude of the frequency compensation effect provided by sensor 400 can be adjustable (trimmable in an application-specific calibration procedure) by operation of the included switches 412a-c. Use of the switches 412a-c can allow selection (e.g., by a user or someone installing the sensor 400) of the number of (actively used) coil turns in coil 402. Connecting more turns will result in a stronger frequency-compensation effect. It should be noted that, while the switches are shown on larger coil 402, the same switching structure and strategy could be used with switches on smaller coil 403, or for maximum adjustment flexibility switches could be included on both coils 402 and 403.

FIG. 5 is a diagram showing steps in an example method of fabricating magnetic field sensors with coil pairs for passive frequency compensation, in accordance with the present disclosure.

Method 500 can include providing a first coil disposed on a first substrate and defining a first footprint on the first substrate, wherein the first coil is configured for inductive coupling with an ambient magnetic field, as described at 502. A second coil can be provided (e.g., that is disposed on a second substrate or within an IC including a magnetic field sensing element or sensor) defining a second footprint on the second substrate, wherein the second coil is disposed within the first footprint, wherein the second footprint is smaller than the first footprint, and wherein the second coil is connected to the first coil, as described at 504. A magnetic field sensor can be provided that is disposed within the second footprint and that includes one or more (e.g., a plurality of) magnetic field sensing elements connected to an integrated circuit (IC), with the magnetic field sensor being configured to detect (sum or superposition of) the ambient magnetic field and a compensating magnetic field produced by the second coil and produce an output signal indicative of a current (in a conductor) producing the ambient magnetic field, as described at 506.

In some embodiments, the first coil can be configured to provide an increasing current as the ambient magnetic field increases with frequency and provide the increasing current to the second coil to compensate for a frequency-dependent coupling factor between the magnetic field sensor and the ambient magnetic field, as described at 508. In some embodiments, the first coil and/or second coil can include a plurality of coil loops (turns) and respective switches connected to the coil loops, wherein each switch is configured to selectively short the respective coil loop for adjusting a number of active coil loops configured to conduct a current in the first coil, as described at 510.

Figure 6:
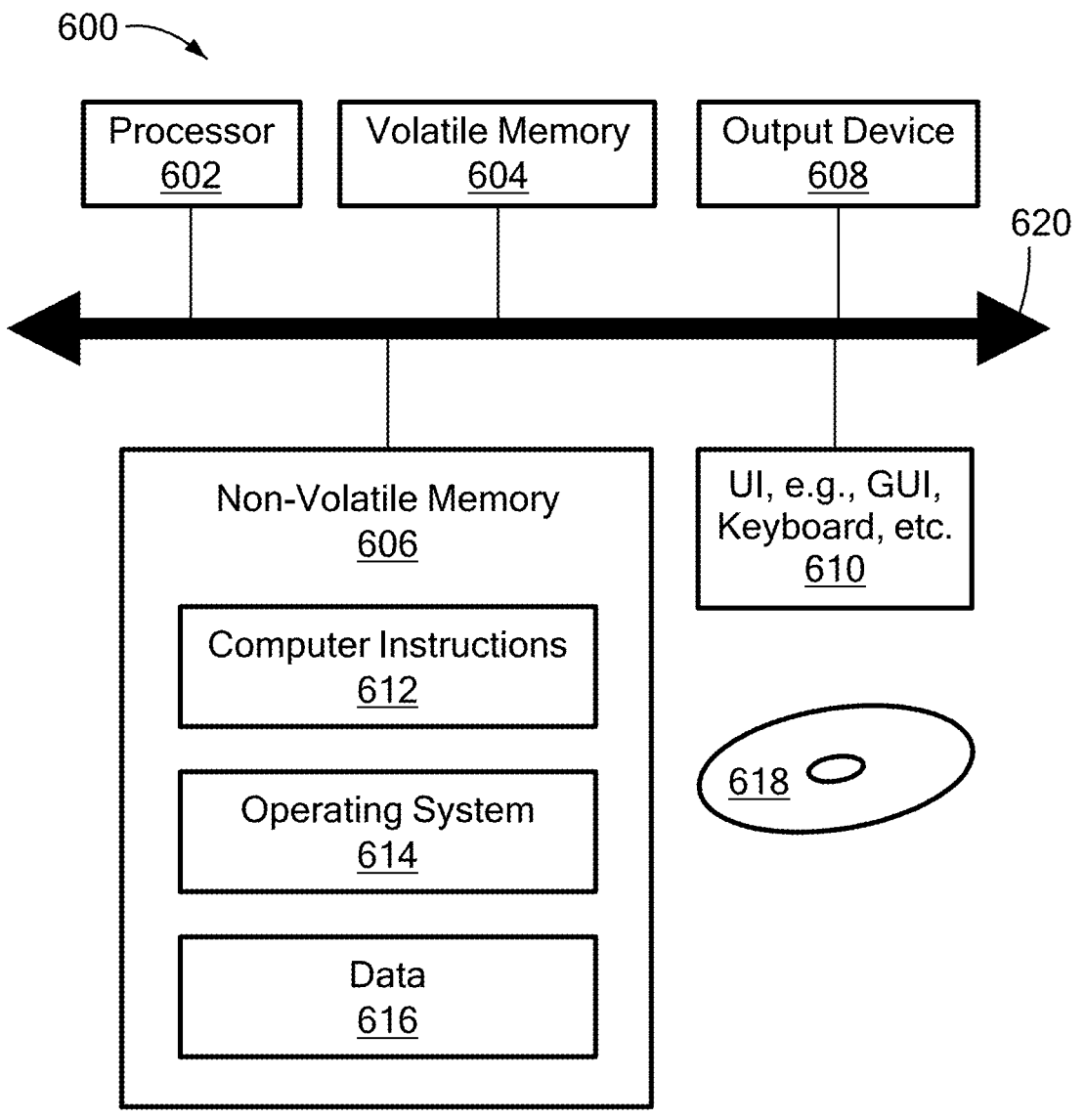
FIG. 6 is a block diagram of an example computer system operative to perform processing, in accordance with the present disclosure.

FIG. 6 is a block diagram of an example computer system 600 operative to perform processing, in accordance with the present disclosure. Computer system 600 can perform all or at least a portion of the processing, e.g., steps in algorithms and methods, described herein, including but not limited to calculating values of electrical current based on signals from a current sensor and/or one or more magnetic field sensing elements. The computer system 600 includes a processor 602, a volatile memory 604, a non-volatile memory 606 (e.g., hard disk, etc.), an output device 608 and a user input or interface (UI) 610, e.g., graphical user interface (GUI), a mouse, a keyboard, a display, and/or any common user interface, etc. The non-volatile memory (non-transitory storage medium) 606 stores computer instructions 612 (a.k.a., machine-readable instructions or computer-readable instructions) such as software (computer program product), an operating system 614 and data 616. In some examples/ embodiments, the computer instructions 612 can be executed by the processor 602 out of (from) volatile memory 604. In some examples/embodiments, an article 618 (e.g., a storage device or medium such as a hard disk, an optical disc, magnetic storage tape, optical storage tape, flash drive, etc.) includes or stores the non-transitory computer-readable instructions. Bus 620 is also shown. In some embodiments, one or more components of system 600 can be disposed on or connected to one or more integrated circuits on one or more semiconductor die.

Processing may be implemented in hardware, software, or a combination of the two. Processing may be implemented in computer programs (e.g., software applications) executed on programmable computers/machines that each includes a processor, a storage medium or other article of manufacture that is readable by the processor (including volatile and non-volatile memory and/or storage elements), and optionally at least one input device, and one or more output devices. Program code may be applied to data entered using an input device or input connection (e.g., a port or bus) to perform processing and to generate output information.

The system 600 can perform processing, at least in part, via a computer program product or software application, (e.g., in a machine-readable storage device), for execution by, or to control the operation of, data processing apparatus (e.g., a programmable processor, a computer, or multiple computers). Each such program may be implemented in a high-level procedural or object-oriented programming language to communicate with a computer system. The programs may be implemented in assembly or machine language. The language may be a compiled or an interpreted language and it may be deployed in any form, including as a stand-alone program or as a module, component, subroutine, or other unit suitable for use in a computing environment. A computer program may be deployed to be executed on one computer or on multiple computers at one site or distributed across multiple sites and interconnected by a communication network. A computer program may be stored on a storage medium or device (e.g., CD-ROM, hard disk, or magnetic diskette) that is readable by a general or special purpose programmable computer for configuring and operating the computer when the storage medium or device is read by the computer. Processing may also be implemented as a machine-readable storage medium, configured with a computer program, where upon execution, instructions in the computer program cause the computer to operate. Further, the terms "computer" or "computer system" may include reference to plural like terms, unless expressly stated otherwise.

Processing may be performed by one or more programmable processors executing one or more computer programs to perform the functions of the system. All or part of the system may be implemented as special purpose logic circuitry, e.g., an FPGA (field programmable gate array) and/or an ASIC (application-specific integrated circuit). In some examples, digital logic circuitry, e.g., one or more FPGAs, can be operative as one or more processors as described herein.

Accordingly, embodiments and/or examples of the inventive subject matter can afford various benefits relative to prior art techniques. For example, embodiments and examples of the present disclosure can enable or facilitate improved accuracy for current measurement of currents at higher frequencies.

Various embodiments of the concepts, systems, devices, structures, and techniques sought to be protected are described above with reference to the related drawings. Alternative embodiments can be devised without departing from the scope of the concepts, systems, devices, structures, and techniques described. For example, in some embodiments, one or both coils of a coil pair may have a whole number or a fractional number of turns (loops or structures configured around a related magnetic field sensing element), e.g., 1.5, 2.5, 1.75, 1.8, 2.25, 5, 6.5, 8.8, etc.

It is noted that various connections and positional relationships (e.g., over, below, adjacent, etc.) may be used to describe elements and components in the description and drawings. These connections and/or positional relationships, unless specified otherwise, can be direct or indirect, and the described concepts, systems, devices, structures, and techniques are not intended to be limiting in this respect. Accordingly, a coupling of entities can refer to either a direct or an indirect coupling, and a positional relationship between entities can be a direct or indirect positional relationship.

As an example of an indirect positional relationship, positioning element "A" over element "B" can include situations in which one or more intermediate elements (e.g., element "C") is between elements "A" and elements "B" as long as the relevant characteristics and functionalities of elements "A" and "B" are not substantially changed by the intermediate element(s).

Also, the following definitions and abbreviations are to be used for the interpretation of the claims and the specification. The terms "comprise," "comprises," "comprising," "include," "includes," "including," "has," "having," "contains" or "containing," or any other variation are intended to cover a non-exclusive inclusion. For example, an apparatus, a method, a composition, a mixture, or an article, which includes a list of elements is not necessarily limited to only those elements but can include other elements not expressly listed or inherent to such apparatus, method, composition, mixture, or article.

Additionally, the term "exemplary" means "serving as an example, instance, or illustration." Any embodiment or design described as "exemplary" is not necessarily to be construed as preferred or advantageous over other embodiments or designs. The terms "one or more," "plurality," and "at least one" may indicate any integer number greater than or equal to one, i.e., one, two, three, four, etc.; those terms, however, may refer to fractional numbers/values where context admits, e.g., a number of loops in a coil of a coil pair may be a plurality that includes a fractional value, e.g., 2.75, 3.5, 4.25, etc. The term "connection" can include an indirect connection and a direct connection.

References in the specification to "embodiments," "one embodiment, "an embodiment," "an example embodiment," "an example," "an instance," "an aspect," etc., indicate that the embodiment described can include a particular feature, structure, or characteristic, but every embodiment may or may not include the particular feature, structure, or characteristic. Moreover, such phrases do not necessarily refer to the same embodiment. Further, when a particular feature, structure, or characteristic is described in connection with an embodiment, it may affect such feature, structure, or characteristic in other embodiments whether explicitly described or not.

Relative or positional terms including, but not limited to, the terms "upper," "lower," "right," "left," "vertical," "horizontal, "top," "bottom," and derivatives of those terms relate to the described structures and methods as oriented in the drawing figures. The terms "overlying," "atop," "on top, "positioned on" or "positioned atop" mean that a first element, such as a first structure, is present on a second element, such as a second structure, where intervening elements such as an interface structure can be present between the first element and the second element. The term "direct contact" means that a first element, such as a first structure, and a second element, such as a second structure, are connected without any intermediary elements.

Use of ordinal terms such as "first," "second," "third," etc., in the claims to modify a claim element does not by itself connote any priority, precedence, or order of one claim element over another, or a temporal order in which acts of a method are performed but are used merely as labels to distinguish one claim element having a certain name from another element having a same name (but for use of the ordinal term) to distinguish the claim elements.

The terms "approximately" and "about" may be used to mean within ±20% of a target (or nominal) value in some embodiments, within plus or minus (±) 10% of a target value in some embodiments, within ±5% of a target value in some embodiments, and yet within ±2% of a target value in some embodiments. The terms "approximately" and "about" may include the target value. The term "substantially equal" may be used to refer to values that are within ±20% of one another in some embodiments, within ±10% of one another in some embodiments, within ±5% of one another in some embodiments, and yet within ±2% of one another in some embodiments.

The term "substantially" may be used to refer to values that are within ±20% of a comparative measure in some embodiments, within ±10% in some embodiments, within ±5% in some embodiments, and yet within ±2% in some embodiments. For example, a first direction that is "substantially" perpendicular to a second direction may refer to a first direction that is within ±20% of making a 90° angle with the second direction in some embodiments, within ±10% of making a 90° angle with the second direction in some embodiments, within ±5% of making a 90° angle with the second direction in some embodiments, and yet within ±2% of making a 90° angle with the second direction in some embodiments.

The disclosed subject matter is not limited in its application to the details of construction and to the arrangements of the components set forth in the following description or illustrated in the drawings. The disclosed subject matter is capable of other embodiments and of being practiced and implemented in various ways.

Also, the phraseology and terminology used in this patent are for the purpose of description and should not be regarded as limiting. As such, the conception upon which this disclosure is based may readily be utilized as a basis for the designing of other structures, methods, and systems for carrying out the several purposes of the disclosed subject matter. Therefore, the claims should be regarded as including such equivalent constructions as far as they do not depart from the spirit and scope of the disclosed subject matter.

Although the disclosed subject matter has been described and illustrated in the foregoing exemplary embodiments, the present disclosure has been made only by way of example. Thus, numerous changes in the details of implementation of the disclosed subject matter may be made without departing from the spirit and scope of the disclosed subject matter.

Accordingly, the scope of this patent should not be limited to the described implementations but rather should be limited only by the spirit and scope of the following claims.

All publications and references cited in this patent are expressly incorporated by reference in their entirety.

What is claimed is:

1. A frequency-compensating current sensor comprising:
a first coil disposed on a first substrate and defining a first footprint on the first substrate, wherein the first coil is configured for inductive coupling with an ambient magnetic field;
a second coil disposed on a second substrate and defining a second footprint on the second substrate, wherein the second coil is disposed within the first footprint, wherein the second footprint is smaller than the first footprint, and wherein the second coil is connected to the first coil; and
a magnetic field sensor disposed within the second footprint and including a plurality of magnetic field sensing elements connected to an integrated circuit (IC), wherein the magnetic field sensor is configured to detect the ambient magnetic field and a compensating magnetic field produced by the second coil, and produce an output signal indicative of a current producing the ambient magnetic field;
wherein the first coil is configured to provide an increasing current as the frequency of the ambient magnetic field increases and provide the increasing current to the second coil to compensate for a frequency-dependent coupling factor between the magnetic field sensor and the ambient magnetic field.

2. The sensor of claim 1, wherein the first substrate comprises a printed circuit board (PCB).

3. The sensor of claim 1, wherein the first substrate comprises the second substrate.

4. The sensor of claim 1, wherein the second substrate comprises a semiconductor die.

5. The sensor of claim 4, wherein the IC is disposed on the semiconductor die.

6. The sensor of claim 1, wherein the plurality of magnetic field sensing elements are configured in a bridge.

7. The sensor of claim 6, wherein the plurality of magnetic field sensing elements comprises a plurality of Hall effect elements.

8. The sensor of claim 6, wherein the plurality of magnetic field sensing elements comprises a plurality of magnetoresistance (MR) elements.

9. The sensor of claim 8, wherein the plurality of magnetoresistance (MR) elements comprises a plurality of tunneling magnetoresistance (TMR) elements.

10. The sensor of claim 8, wherein the plurality of magnetoresistance (MR) elements comprises a plurality of giant magnetoresistance (GMR) elements.

11. The sensor of claim 8, wherein the plurality of magnetoresistance (MR) elements comprises a plurality of anisotropic magnetoresistance (AMR) elements.

12. The sensor of claim 1, wherein the first coil comprises a plurality of coil loops and respective switches connected to the plurality of coil loops, wherein each switch is configured to selectively short the respective coil loop for adjusting a number of active coil loops configured to conduct a current in the first coil.

13. The sensor of claim 1, wherein the second coil comprises a plurality of coil loops and respective switches connected to the plurality of coil loops, wherein each switch is configured to selectively short the respective coil loop for adjusting a number of active coil loops configured to conduct a current in the second coil.

14. A method of making a frequency-compensating current sensor, the method comprising:

providing a first coil disposed on a first substrate and defining a first footprint on the first substrate, wherein the first coil is configured for inductive coupling with an ambient magnetic field;

providing a second coil disposed on a second substrate and defining a second footprint on the second substrate, wherein the second coil is disposed within the first footprint, wherein the second footprint is smaller than the first footprint, and wherein the second coil is connected to the first coil; and providing a magnetic field sensor disposed within the second footprint and including a plurality of magnetic field sensing elements connected to an integrated circuit (IC), wherein the magnetic field sensor is configured to detect the ambient magnetic field and a compensating magnetic field produced by the second coil, and produce an output signal indicative of a current producing the ambient magnetic field;

wherein the first coil is configured to provide an increasing current as the frequency of the ambient magnetic field increases and provide the increasing current to the second coil to compensate for a frequency-dependent coupling factor between the magnetic field sensor and the ambient magnetic field.

15. The method of claim 14, wherein the first substrate comprises a printed circuit board (PCB).

16. The method of claim 14, wherein the first substrate comprises the second substrate.

17. The method of claim 14, wherein the second substrate comprises a semiconductor die.

18. The method of claim 17, wherein the IC is disposed on the semiconductor die.

19. The method of claim 14, wherein the plurality of magnetic field sensing elements are configured in a bridge.

20. The method of claim 19, wherein the plurality of magnetic field sensing elements comprises a plurality of Hall effect elements.

21. The method of claim 19, wherein the plurality of magnetic field sensing elements comprises a plurality of magnetoresistance (MR) elements.

22. The method of claim 21, wherein the plurality of magnetoresistance (MR) elements comprises a plurality of tunneling magnetoresistance (TMR) elements.

23. The method of claim 21, wherein the plurality of magnetoresistance (MR) elements comprises a plurality of giant magnetoresistance (GMR) elements.

24. The method of claim 21, wherein the plurality of magnetoresistance (MR) elements comprises a plurality of anisotropic magnetoresistance (AMR) elements.

25. The method of claim 14, wherein the first coil comprises a plurality of coil loops and respective switches, wherein each switch is configured to selectively short the respective coil loop for adjusting a number of active coil loops configured to conduct a current in the first coil.

26. The method of claim 14, wherein the second coil comprises a plurality of coil loops and respective switches, wherein each switch is configured to selectively short the respective coil loop for adjusting a number of active coil loops configured to conduct a current in the second coil.

* * * * *